(12) United States Patent
Formicone

(10) Patent No.: US 10,593,610 B2
(45) Date of Patent: Mar. 17, 2020

(54) SEMICONDUCTOR POWER DEVICE INCLUDING WIRE OR RIBBON BONDS OVER DEVICE ACTIVE REGION

(71) Applicant: Integra Technologies, Inc., El Segundo, CA (US)

(72) Inventor: Gabriele Formicone, Chandler, AZ (US)

(73) Assignee: Integra Technologies, Inc., El Segundo, CA (US)

( * ) Notice: Subject to any disclaimer, the term of this patent is extended or adjusted under 35 U.S.C. 154(b) by 0 days.

(21) Appl. No.: 16/027,074

(22) Filed: Jul. 3, 2018

(65) Prior Publication Data
US 2020/0013692 A1    Jan. 9, 2020

(51) Int. Cl.
| | | |
|---|---|---|
| *H01L 29/778* | (2006.01) | |
| *H01L 23/34* | (2006.01) | |
| *H01L 23/528* | (2006.01) | |
| *H01L 23/535* | (2006.01) | |
| *H01L 23/495* | (2006.01) | |
| *H01L 23/498* | (2006.01) | |
| *H01L 23/64* | (2006.01) | |
| *H01L 23/00* | (2006.01) | |
| *H01L 23/48* | (2006.01) | |
| *H01L 23/492* | (2006.01) | |
| H01L 29/16 | (2006.01) | |
| H01L 29/73 | (2006.01) | |
| H01L 29/20 | (2006.01) | |

(52) U.S. Cl.
CPC ............ *H01L 23/34* (2013.01); *H01L 23/481* (2013.01); *H01L 23/492* (2013.01); *H01L 23/49562* (2013.01); *H01L 23/49894* (2013.01); *H01L 23/528* (2013.01); *H01L 23/535* (2013.01); *H01L 23/642* (2013.01); *H01L 24/48* (2013.01); H01L 29/1608 (2013.01); H01L 29/2003 (2013.01); H01L 29/73 (2013.01); H01L 29/778 (2013.01); H01L 2224/48157 (2013.01); H01L 2224/48177 (2013.01); H01L 2224/48195 (2013.01)

(58) Field of Classification Search
CPC .......................... H01L 29/778; H01L 29/7786
See application file for complete search history.

(56) References Cited

U.S. PATENT DOCUMENTS 8,680,579 B2 *   3/2014   Briere ................. H01L 27/0605
                                                    257/194
2017/0317015 A1 * 11/2017  Lee ..................... H01L 23/3107

* cited by examiner

*Primary Examiner* — Jae Lee
(74) *Attorney, Agent, or Firm* — George Fountain; Loza & Loza LLP

(57) ABSTRACT

A semiconductor power device including a base plate; an input lead; an output lead; a field effect transistor (FET) power die disposed over the base plate, wherein the FET power die includes a set of source fingers, a set of drain fingers, and a set of gate fingers disposed directly over an active region, wherein the gate fingers are configured to receive an input signal from the input lead, and wherein the FET power die is configured to process the input signal to generate an output signal at the drain fingers for routing to the output lead; and electrical conductors (wirebonds or ribbons) bonded to the source and/or drain directly over the active region of the FET power die. The electrical conductors produce additional thermal paths between the active region and the base plate for thermal management of the FET power die.

19 Claims, 6 Drawing Sheets

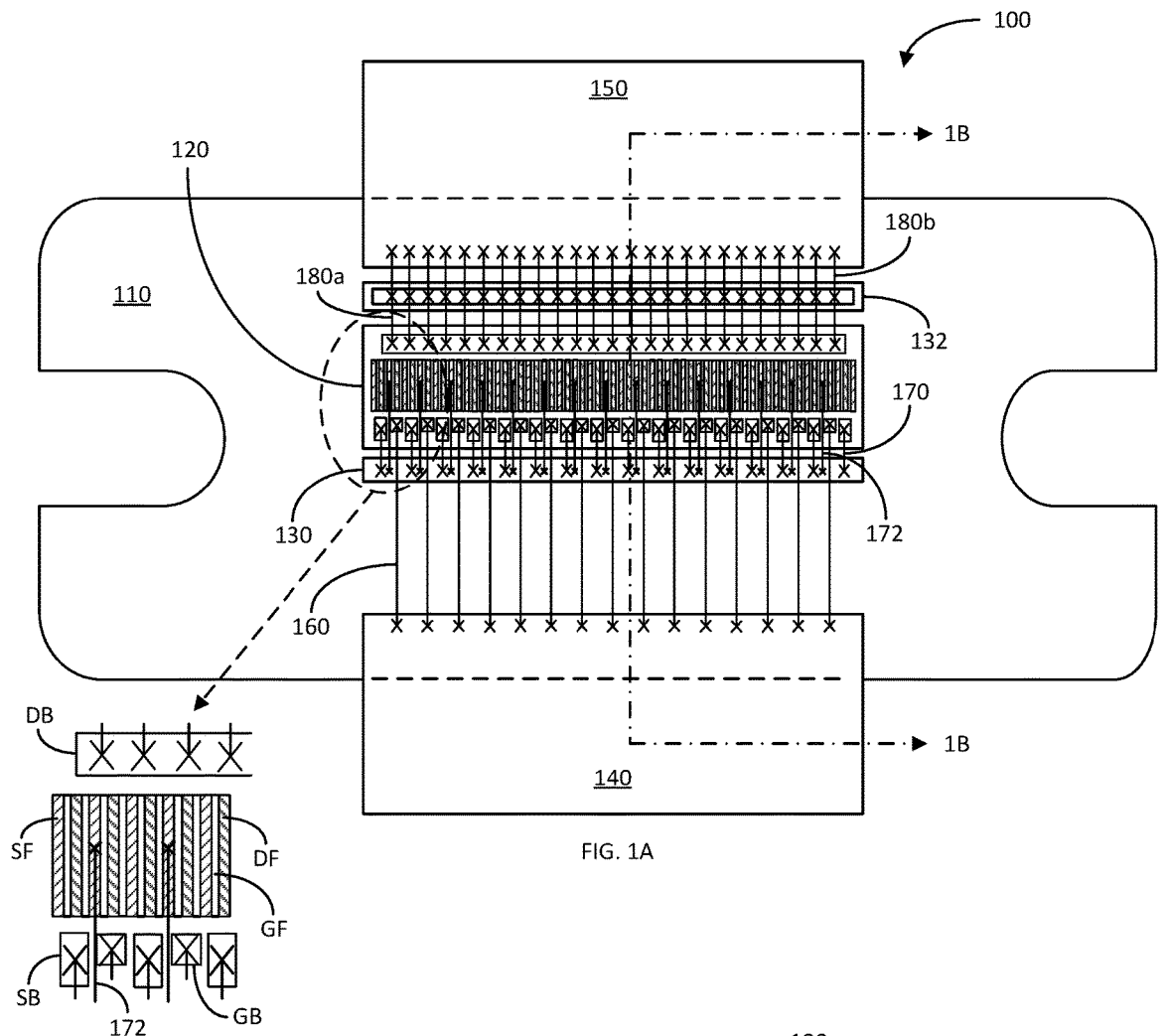
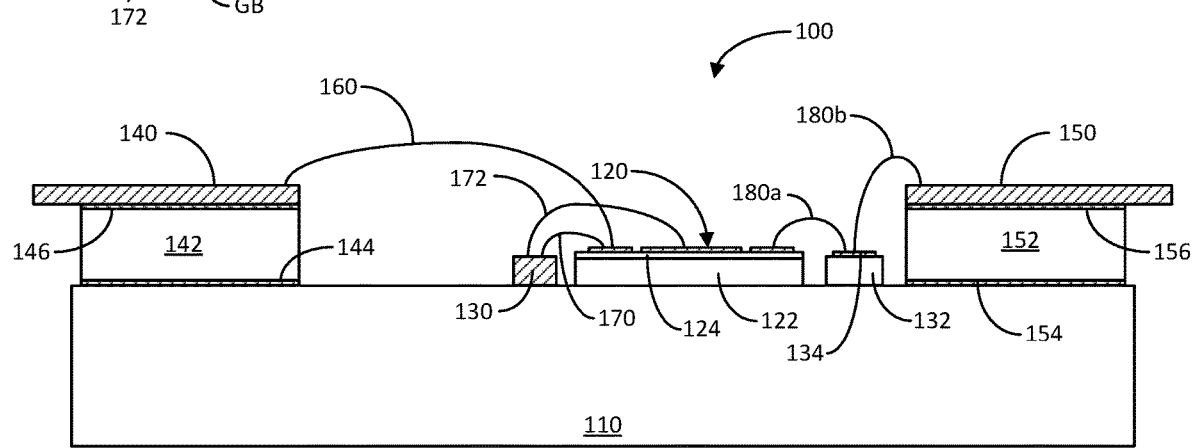

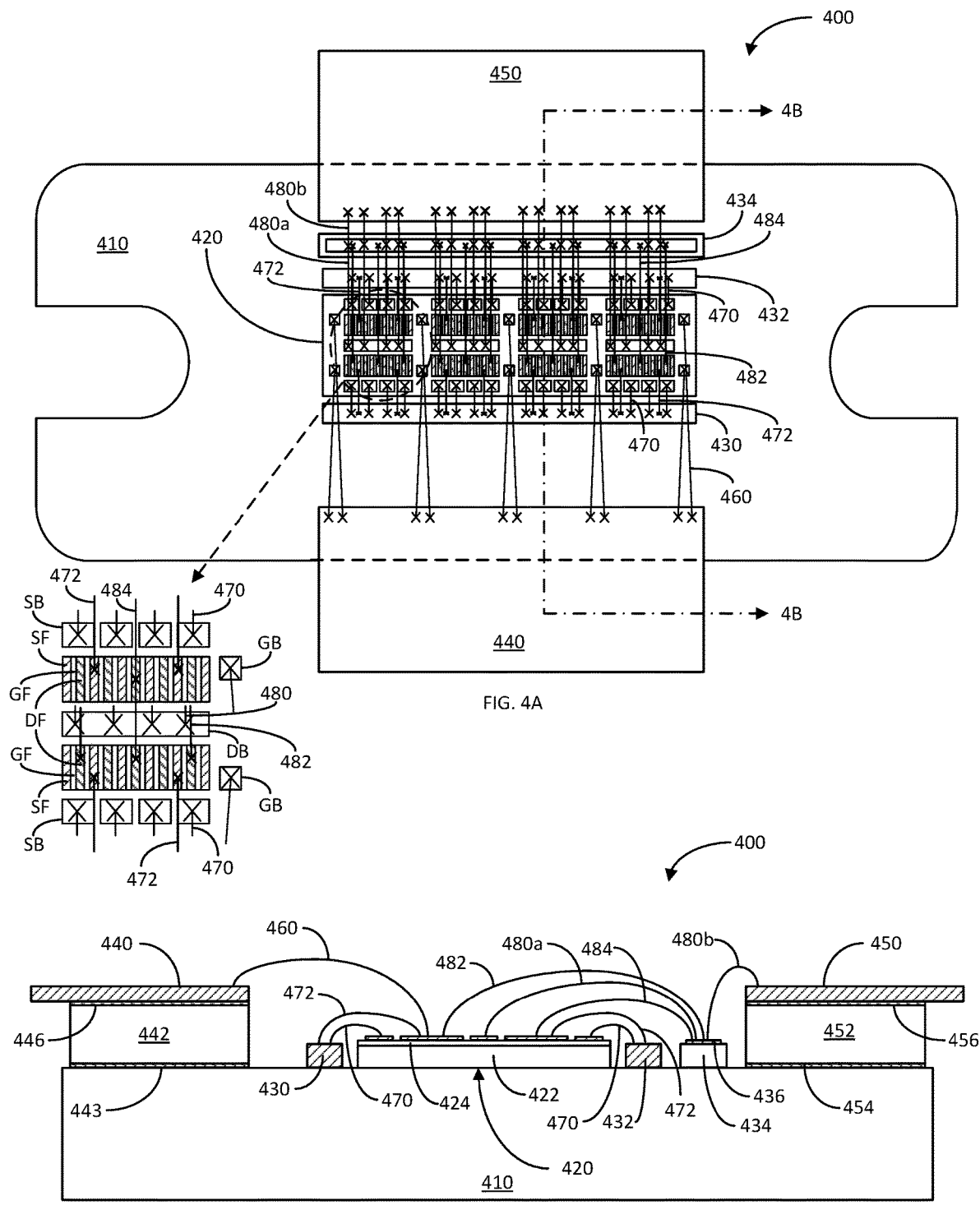

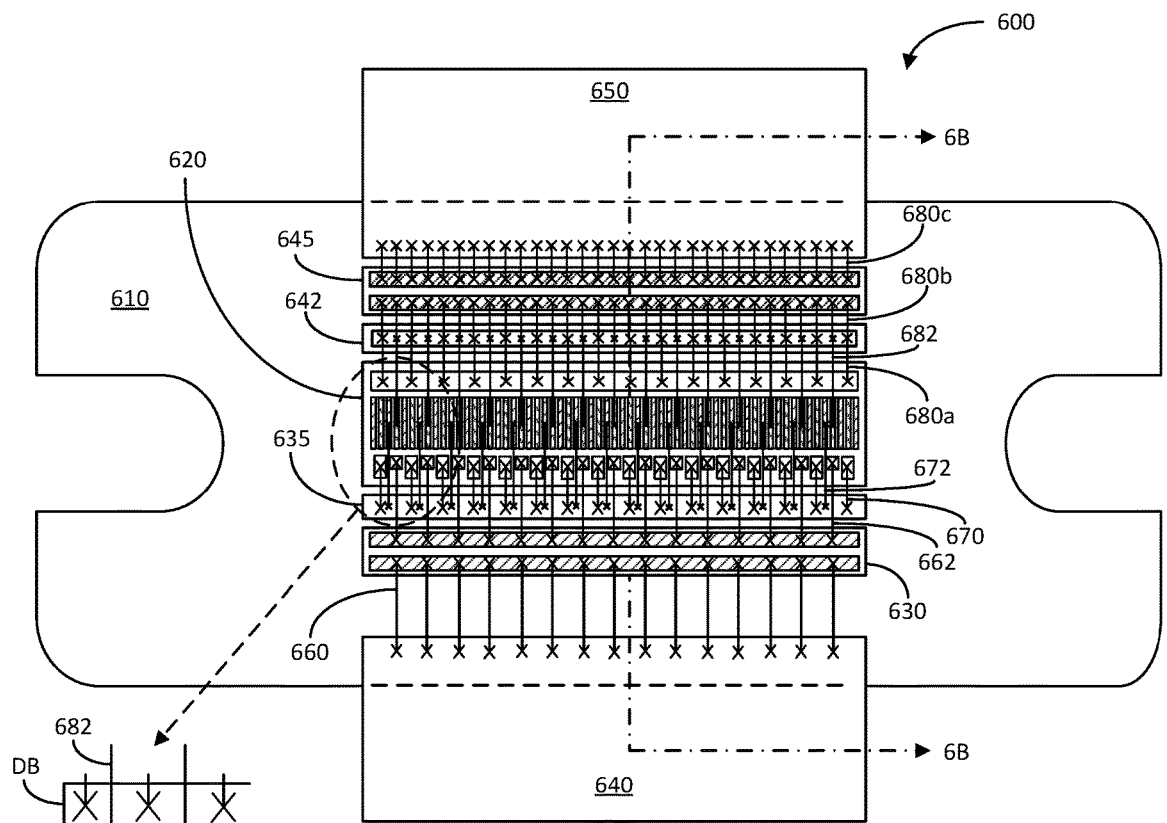
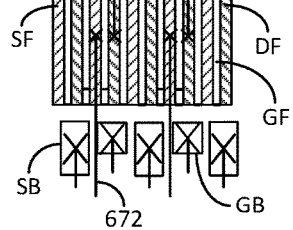
FIG. 6A
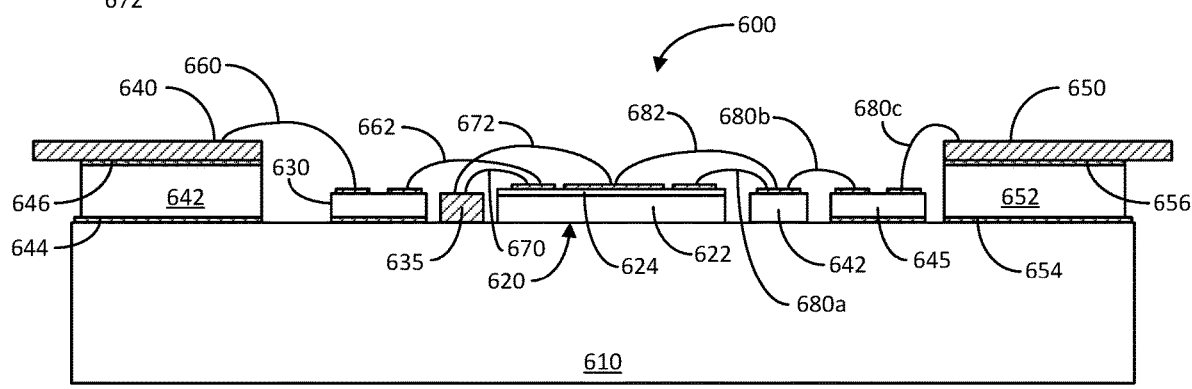
FIG. 6B

SEMICONDUCTOR POWER DEVICE INCLUDING WIRE OR RIBBON BONDS OVER DEVICE ACTIVE REGION

GOVERNMENT RIGHTS STATEMENT

This invention was made with government support under DE-SC0017898 awarded by the United States Department of Energy. The government has certain rights in the invention.

FIELD

Aspects of the present disclosure relate generally to semiconductor power devices, and more particularly, to a semiconductor power device including electrical-conductor (e.g., wire or ribbon) bonds attached to metallization directly over an active region of the device to reduce the junction or channel temperature in the active region of the device or allow the device to be operated in a higher power configuration (e.g., higher bias or voltage) while maintaining the device operation below the allowable maximum junction temperature.

BACKGROUND

A semiconductor power device usually generates a substantial amount of heat at and near its active region. Usually, a maximum temperature, often referred to as the maximum junction temperature, is specified at which the temperature of the active region should not exceed so that the semiconductor power device may be operated in a safe and reliable manner.

Generally, the semiconductor material used in the semiconductor power device are optimized for processing signals at high frequencies, such as radio frequency (RF), microwave, and millimeter wave, but not necessarily optimized to remove heat from the active region of the semiconductor power device. Accordingly, the effective junction or channel temperature in such semiconductor material is generally undesirably high.

Thus, there is a need to reduce the temperature of the active region or allow the semiconductor power device to be operated at higher power configurations while not exceeding the maximum junction temperature.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to a semiconductor power device including a base plate; an input lead; an output lead; a semiconductor power die disposed over the base plate, wherein the semiconductor power die is configured to receive an input signal from the input lead and generate an output signal at the output lead, and wherein the semiconductor power die includes metallization disposed over an active region; and a first set of one or more electrical conductors attached to the metallization directly over the active region of the semiconductor power die. The semiconductor power die may be configured as a field effect transistor (FET) type device, as a bipolar junction type device, or some other type of device. The electrical conductors attached to metallization over the active region produces additional thermal paths to the base plate for thermal management of the semiconductor power die.

Another aspect of the disclosure relates to a semiconductor power device including a base plate; an input lead; an output lead; a field effect transistor (FET) power die disposed over the base plate, wherein the FET power die includes a set of source fingers, a set of drain fingers, and a set of gate fingers disposed directly over an active region, wherein the set of gate fingers is configured to receive an input signal from the input lead, and wherein the FET power die is configured to process the input signal to generate an output signal at the set of drain fingers for routing to the output lead; and a set of one or more electrical conductors attached to at least one of the set of source fingers or the set of drain fingers directly over the active region of the FET power die. FET power die is configured as a gallium-nitride (GaN) on silicon carbide (SiC) high electron mobility transistor (HEMT). The electrical conductors attached to the source and/or drain fingers produces additional thermal paths to the base plate for thermal management of the FET power die.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

BRIEF DESCRIPTION OF THE DRAWINGS

FIGS. 1A-1B illustrate top and cross-sectional views of an exemplary semiconductor power device in accordance with an aspect of the disclosure.

FIGS. 4A-4B illustrate top and cross-sectional views of another exemplary semiconductor power device in accordance with another aspect of the disclosure.

FIGS. 6A-6B illustrate top and cross-sectional views of another exemplary semiconductor power device in accordance with another aspect of the disclosure.

DETAILED DESCRIPTION

Figure 2A:
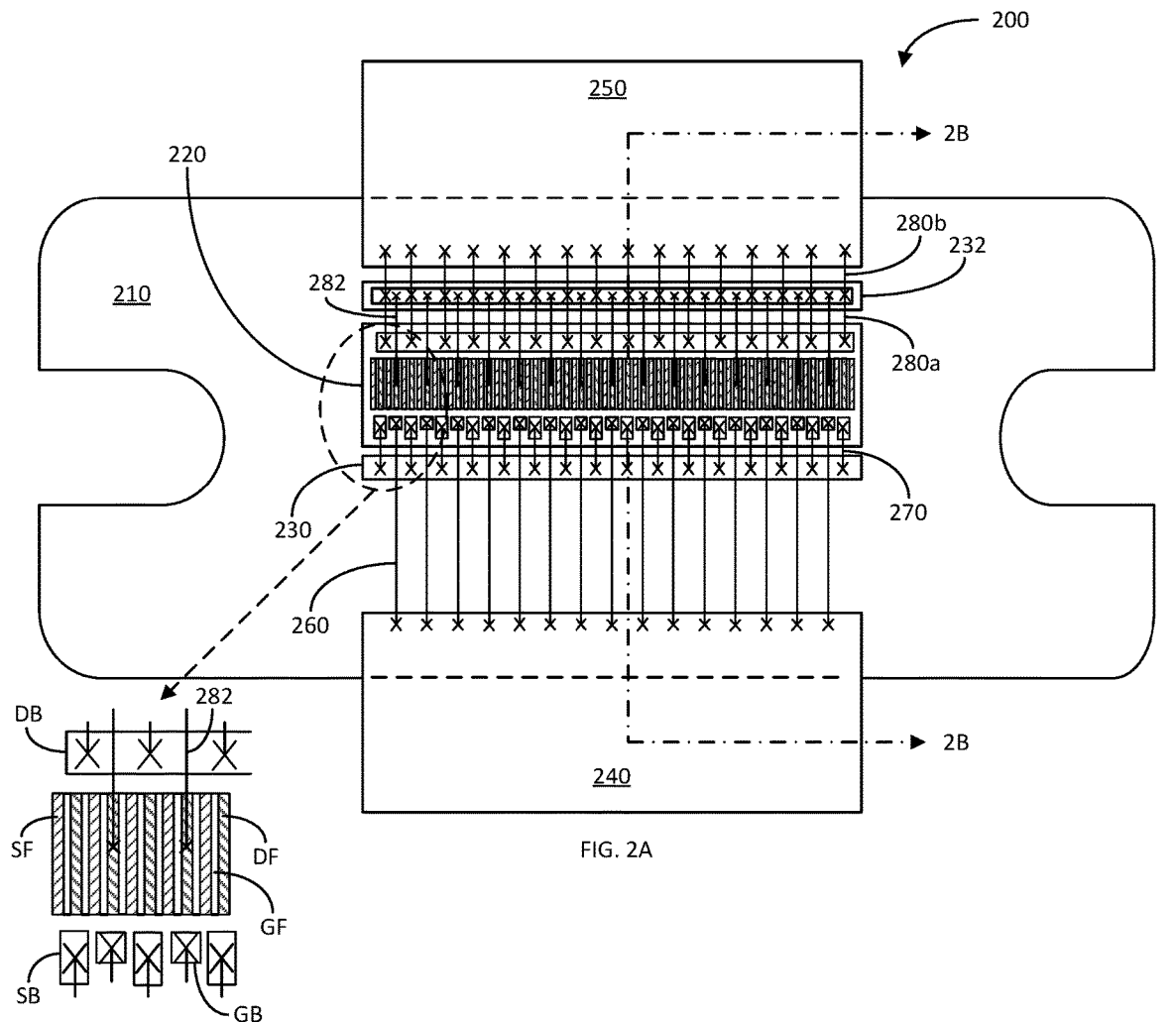
FIGS. 2A-2B illustrate top and cross-sectional views of another exemplary semiconductor power device in accordance with another aspect of the disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

This disclosure describes a new method for reducing the junction temperature associated with a semiconductor high power chip or die. The method entails conducting heat from an active region of the semiconductor power die via one or more electrical-conductors (e.g., wire or ribbons) attached (e.g., bonded) to metallization directly over the active region of the semiconductor power die. In the case of a semiconductor power die configured as a field effect transistor (FET) type device, the active region is the channel. Thus, as exemplified herein, the electrical-conductors may be attached (e.g., bonded) to the source and/or drain fingers of the FET type device. In the case of a bipolar junction type device, the active region is the p-n and n-p junctions. As an example, the electrical-conductors may be attached (e.g., bonded) to the emitter metallization directly over the p-n or n-p junction of the bipolar junction type device.

The specific application described herein is for a high power radio frequency (RF) Gallium-Nitride (GaN) on Silicon-Carbide (SiC) die. However, this method could be applied to any high power die technology being used at any frequency from direct current (DC) to millimeter wave. For instance, the methods described herein are applicable to any digital, analog, power switching, or high frequency RF device. For a more specific example, the method described herein may be applied to vertical diffused metal oxide semiconductor (VDMOS) FET type devices, lateral diffused metal oxide semiconductor (LDMOS) type devices, insulated-gate bipolar transistors (IGBT) as well as bipolar junction type devices.

High power RF transistors have a maximum junction operating temperature for reliable operation. The junction temperature is determined by the power dissipation times the thermal impedance. In typical applications, the thermal impedance is determined by the heat flow from the device junction or active region near the top surface of the die down through the die substrate material. Usually, the thermal conductivity of the substrate material has a finite value, and may degrade as the die temperature increases.

The use of GaN on SiC to fabricate High Electron Mobility Transistors (HEMTs) enables much higher power densities than previous transistor technologies. Additionally, operation at increasing bias voltage also enables much higher power densities than operation at lower or reduced bias voltage. The higher power densities also generate more heat in a smaller area due to internal power dissipation. The smaller area of dissipation reduces the cross-sectional area of the heat dissipation path, which increases the junction temperatures. The following describes various techniques to reduce the junction temperature and allow the device to be operated within safe and reliable temperature margins. Alternatively, the various techniques increase the power conversion efficiency of the device which reduces the junction or channel temperature of the device by reducing the dissipated power without necessarily reducing the thermal impedance.

FIG. 1A illustrates a top view of an exemplary semiconductor power device 100 in accordance with an aspect of the disclosure. The semiconductor power device 100 includes a metallic (e.g., copper alloy) base plate 110 (e.g., a package flange, but it could also be a printed circuit board (PCB)/RF laminate back-side integrated heat sink carrier in a "chip and wire" module technology), a power semiconductor die 120 disposed substantially on the base plate 110, a grounding metallic (e.g., copper alloy) bar 130 disposed substantially on the base plate 110, a bond support 132 disposed substantially on the base plate 110, an input lead 140 disposed substantially on the base plate 110 via an electrical insulator 142 (shown in FIG. 1B), and an output lead 150 disposed substantially on the base plate 110 via another electrical insulator 152 (shown in FIG. 1B). In this example, the semiconductor power die 120 is configured as a field effect transistor (FET) type device, such as a GaN on SiC HEMT, but other types of semiconductor devices are applicable to the concepts described herein.

Although not shown, the semiconductor power device 100 may include a cover mounted substantially on the base plate 110 so as to enclose the semiconductor power die 120, metallic bar 130, bond support 132, and portions of the input and output leads 140 and 150. Further, the illustration shown in FIG. 1A (and FIG. 1B discussed below) may not be to scale. For example, the semiconductor power die 120 may be much smaller compared to the base plate 110, but is shown larger herein for description purposes. Additionally, depending on the output signal power requirement for the semiconductor power device 100, a plurality of semiconductor power dies 120 may be coupled in parallel between the input and output leads 140 and 150.

With further reference to FIG. 1B, which illustrates a cross-sectional view of the semiconductor power device 100 along line 1B-1B of FIG. 1A, the semiconductor power die 120 includes a SiC substrate 122 disposed substantially on the base plate 110, and a GaN layer 124 disposed on the SiC substrate 122. As viewed from the top (and better depicted in the blow-up view shown in FIG. 1A), the top surface of the semiconductor power die 120 includes a set of gate bonding (metallization) pads (GB), a set of source bonding (metallization) pads (SB), a drain bonding (metallization) pad electrode (DB), a set of source (metallization) fingers (SF), a set of drain (metallization) fingers (DF), and a set of gate fingers (GF), all of which are disposed on the GaN layer 124.

In this example, the region of the GaN layer 124 directly below the source, drain, and get fingers (SF, DF, and GF) is the active region as that region constitutes the channel of the device 120. The region of the GaN layer 124 directly below the source, drain, and gate bonding pads (SB, DB, and GB) is not the active region as the channel of the device 120 is not situated directly below the bonding pads. As discussed in more detail herein, one or more electrical-conductors (e.g., bond wires or ribbons) are bonded to one or more of the source and/or drain fingers to produce another thermal path between the active region of the device 120 and the base plate 110, which substantially functions as thermal ground. It shall be understood that the single drain bonding pad (DB) could be designed as an array of smaller drain bond pads adjacent to each other.

The semiconductor power device 100 further includes a set of wirebonds or conductive-ribbons (generally, electrical conductors) 160 electrically coupling the input lead 140 to the set of gate bonding pads (GB) of the semiconductor power die 120, respectively. As discussed herein with reference to another implementation, it shall be understood that there may be other components (e.g., resistor, capacitor, and/or inductor) coupled between the input lead 140 and the set of gate bonding pads (GB) of the semiconductor die 120, between the input lead 140 and the base plate 110, and/or the set of gate bonding pads (GB) and the base plate 110. Such components may be used to configure the semiconductor power device 100 with desirable characteristics, such as to improve the electrical or RF impedance match between the input of the semiconductor power device 100 and an input transmission line (not shown) coupled to the input lead 140.

Alternatively, in a "chip and wire" implementation, the input lead 140 is the input transmission line itself.

Additionally, the semiconductor power device 100 includes another set of wirebonds or conductive-ribbons (generally, electrical conductors) 170 electrically coupling the set of source bonding pads (SB) of the semiconductor power die 120 to the base plate 110 via the metallic bar 130 for electrical grounding purposes.

Also, the semiconductor power device 100 includes yet another set of wirebonds or conductive-ribbons (generally, electrical conductors) 180*a* electrically coupling the drain bonding pad (DB) of the semiconductor power die 120 to a top metallization layer 134 of the bond support 132, and another set of wirebonds or conductive ribbons (generally, electrical conductors) 180*b* electrically coupling the top metallization layer 134 of the bond support 132 to the output lead 150. The bond support 132 may be made out of a relatively high thermal conductivity material, such as beryllium oxide (BeO), silicon carbide (SiC), diamond, graphite or aluminum nitride (AlN), or a composite matrix of these with other materials or any other electrically insulating or semi-insulating high thermal conductivity material for improving the heat removal from the semiconductor power die 120 via the one or more electrical conductors 180*a*.

Similarly, as discussed further herein in connection with another implementation, it shall be understood that there may be other components (e.g., resistor, capacitor, and/or inductor) coupled between the drain bonding pad (DB) of the semiconductor die 120 and the output lead 150, the drain bonding pad (DB) and the base plate 110, and/or the base plate 110 and the output lead 150. Such components may be used to configure the semiconductor power device 100 with desirable characteristics, such as to improve the electrical or RF impedance match between the output of the semiconductor power device 100 and an output transmission line (not shown) coupled to the output lead 150. Alternatively, in a "chip and wire" implementation, the output lead 150 is the input transmission line itself.

As better illustrated in FIG. 1B, the relative thickness (although may not be to scale) between the GaN layer 124, the SiC substrate 122, and base plate 110 are shown. As an example, the GaN layer 124 may have a thickness of approximately one (1) micrometer (μm), the SiC substrate 122 may have a thickness of approximately 75 μm, and the base plate 110 may have a thickness of approximately 1000 μm. The base plate 110 may be made out of a high thermal and electrical conductivity material, such as a copper alloy. In "chip and wire" technology, the base plate 110 may be thicker up to centimeter scale and incorporate fins on the back or bottom side for air cooling or internal pipes for liquid cooling.

During operation, the top surface or active region (e.g., FET channel) of the GaN layer 124 may be operating at temperatures around 200° C., while the base plate 110 may be operating at temperatures around 60° C. At 200° C., both the GaN layer 124 and the SiC substrate 122 have lower thermal conductivity (e.g., 140 and 180 W/m-K, respectively) compared to operation at 60° C. Because the GaN layer 124 is very thin compared to the SiC substrate 122, the main contributor to the thermal impedance between the top surface or active region of the GaN layer 124 and the base plate 110 (which, because of its high thermal conductivity, substantially acts as thermal ground) is the SiC substrate 122. Thus, as illustrated in FIG. 1B, the effective thermal impedance between the top surface of the GaN layer 124 and the base plate 110 is the thermal impedance of the SiC substrate 122.

As the thermal conductivity of the SiC substrate 122 is further degraded at high temperatures (e.g., around 200° C.) compared to lower temperatures (e.g., 30-60° C.), the semiconductor power device 100 further includes one or more electrical conductors 172 (e.g., wirebonds or ribbons) attached (e.g., bonded) at one end to one or more source fingers (SF) and attached (e.g., bonded) at the other end to the metallic bar 130. Alternatively, the metallic bar 130 may be omitted and in such configuration the electrical conductors 172 (e.g., wirebonds or ribbons) may be attached (e.g., bonded) at one end to one or more source fingers (SF) and attached (e.g., bonded) at the other end to the base plate 110. As, in this example, the source of the semiconductor power die 120 needs to be grounded, the one or more electrical conductors 172 provide electrical grounding for the source in conjunction with the electrical conductors 170 from the set of source bonding pads (SB) to the base plate 110 via the metallic bar 130.

However, because the one or more electrical conductors 172 make contact to one or more source fingers (SF), which lies directly over the active region of the semiconductor power die 120, where most of the heat is generated, the one or more electrical conductors 172 provide one or more thermal paths between the active region and the base plate 110 at substantially thermal ground. This reduces the thermal impedance between the active region and the base plate 110 or reduces the junction temperature of the device 120 or allows the device 120 to operate at higher power configurations while maintaining the junction temperature within safe and reliable limits. As discussed, the one or more electrical conductors 172 may be configured as wirebonds or conductive-ribbons with a thickness between 0.5 to 3 mils or greater to achieve the desired thermal impedance or junction temperature.

In this example, the electrical conductors 172 are distributed across the semiconductor power die 120 bonded at one end to every other adjacent source finger (SB) and at the other end to the metallic bar 130. This provides a substantially uniform distribution of thermal paths across the semiconductor power die 120. However, it shall be understood that the one or more electrical conductors 172 may be bonded to all or some of the source fingers (SF) in any pattern to achieve the desired thermal management and electrical properties for the semiconductor power die 120.

To complete the description of the semiconductor power device 100, and with specific reference to FIG. 1B, the attachment of the semiconductor power die 120, metallic bar 130, and the bond support 132 to the base plate 110 may be performed in any reliable manner. As illustrated, the input lead 140 may be electrically attached to a top metallization layer 146 disposed on the electrical-insulator 142. The electrical-insulator 142, in turn, may be attached to the base plate 110 via a bottom metallization layer 144. Similarly, the output lead 150 may be electrically attached to a top metallization layer 156 disposed on the electrical-insulator 152. The electrical-insulator 152, in turn, may be attached to the base plate 110 via a bottom metallization layer 154.

The semiconductor power die 120 receives an input signal from the input lead 140 via the set of electrical conductors 160. The semiconductor power die 120 performs some signal processing on (e.g., amplifying) the input signal to generate an output signal. The output signal is then routed to the output lead 150 via the sets of electrical conductors 180*a* and 180*b*.

FIG. 2A illustrates a top view of another exemplary semiconductor power device 200 in accordance with another aspect of the disclosure. In summary, the semiconductor power device 200 is similar to that of semiconductor power device 100, but instead of providing one or more electrical conductors (e.g., wirebonds or ribbons) bonded at one end to one or more source fingers (SF) and the other end to a grounding metallic bar, the semiconductor power device 200 includes one or more electrical conductors attached (e.g., bonded) at one end to one or more drain fingers (DF) and the other end to the top metallization layer of the bond support. Similarly, the one or more electrical conductors bonded to metallization directly over the active region provides additional thermal paths to reduce the thermal impedance between the active region and the base plate at substantially thermal ground, or alternatively to lower the operating junction temperature of the device.

Figure 2B:
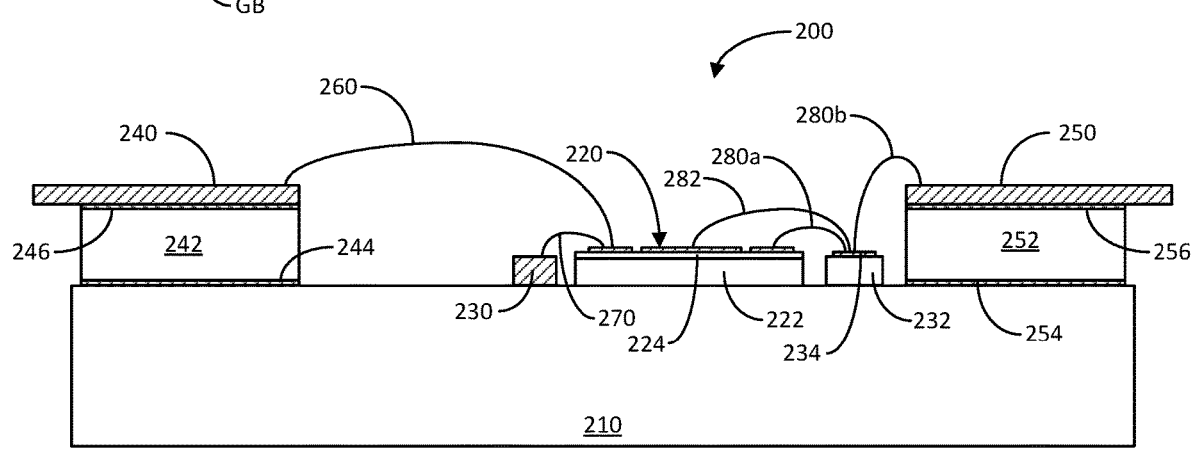

In particular, the semiconductor power device 200 includes a metallic (e.g., copper alloy) base plate 210 (e.g., a flange), a semiconductor power die 220 disposed substantially on the base plate 210, a grounding metallic (e.g., copper alloy) bar 230 disposed substantially on the base plate 210, a bond support 232 disposed substantially on the base plate 210, an input lead 240 disposed on an electrical-insulator 242 (shown in FIG. 2B), and an output lead 250 disposed on another electrical-insulator 252 (shown in FIG. 2B). Again, in this example, the semiconductor power die 220 is configured as a GaN on SiC HEMT, but may be configured as another type of semiconductor device. Although not shown, the semiconductor power device 200 may include a cover mounted substantially on the base plate 210 so as to enclose the semiconductor power die 220, grounding bar 230, bond support 232, and portions of the input and output leads 240 and 250.

With further reference to FIG. 2B, which illustrates a cross-sectional view of the semiconductor power device 200 along line 2B-2B of FIG. 2A, the semiconductor power die 220 includes a SiC substrate 222 disposed substantially on the base plate 210, and a GaN layer 224 disposed on the SiC substrate 222. As illustrated in the accompanying blow up view, the top surface of the semiconductor power die 220 includes a set of gate bonding (metallization) pads (GB), a set of source bonding (metallization) pads (SB), a drain bonding (metallization) pad electrode (DB), a set of source (metallization) fingers (SF), a set of drain (metallization) fingers (DF), and a set of gate fingers (GF), all of which are disposed on the GaN layer 224. It shall be understood that the single drain bonding pad (DB) could be designed as an array of smaller drain bond pads adjacent to each other.

In this example, the region of the GaN layer 224 directly below the source, drain, and get fingers (SF, DF, and GF) is the active region as that region constitutes the channel of the device 220. The region of the GaN layer 224 directly below the source, drain, and gate bonding pads (SB, DB, and GB) is not the active region as the channel of the device 220 is not situated directly below the bonding pads. As discussed in more detail herein, one or more electrical-conductors (e.g., wirebonds or ribbons) 282 are attached (e.g., bonded) to one or more of the drain fingers (DF) to produce additional thermal paths between the active region of the device 220 and the base plate 210, which substantially functions as thermal ground.

The semiconductor power device 200 further includes a set of wirebonds or conductive-ribbons (generally, electrical conductors) 260 electrically coupling the input lead 240 to the set of gate bonding pads (GB) of the semiconductor power die 220, respectively. The semiconductor power die 220 receives an input signal from the input lead 240 via the set of electrical conductors 260. As discussed further herein with respect to another implementation, it shall be understood that there may be other components (e.g., resistor, capacitor, and/or inductor) coupled between the input lead 240 and the set of gate bonding pads (GB) of the semiconductor die 220, between the input lead 240 and the base plate 210, and/or the set of gate bonding pads (GB) and the base plate 210. Such components may be used to configure the semiconductor power device 200 with desirable characteristics, such as to improve the electrical or RF impedance match between the input of the semiconductor power device 200 and an input transmission line (not shown) coupled to the input lead 240.

Additionally, the semiconductor power device 200 includes another set of wirebonds or conductive-ribbons (generally, electrical conductors) 270 electrically coupling the set of source bonding pads (SB) of the semiconductor power die 220 to the base plate 210 via the metallic bar 230 for electrical grounding purpose. Alternatively, the metallic bar 230 may be omitted and in such configuration the set of wirebonds or conductive-ribbons (generally, electrical conductors) 270 electrically couple the set of source bonding pads (SB) of the semiconductor power die 220 directly to the base plate 210 for electrical grounding purpose.

Also, the semiconductor power device 200 includes a set of wirebonds or conductive-ribbons (generally, electrical conductors) 280a electrically coupling the drain bonding pad (DB) of the semiconductor power die 220 to a top metallization layer 234 of the bond support 232, and another set of wirebonds or conductive ribbons (generally, electrical conductors) 280b electrically coupling the top metallization layer 234 of the bond support 232 to the output lead 250. The bond support 232 may be made out of a relatively high thermal conductivity material, such as beryllium oxide (BeO), silicon carbide (SiC), diamond, graphite or aluminum nitride (AlN), or a composite matrix of these with other materials or any other electrically insulating or semi-insulating high thermal conductivity material for improving the heat removal from the semiconductor power die 220 via the one or more electrical conductors 280a.

The semiconductor power die 220 produces an output signal (based on the input signal (e.g., by amplifying the input signal)) at the output lead 250 via the sets of electrical conductors 280a and 280b. As discussed further herein with respect to another implementation, it shall be understood that there may be other components (e.g., resistor, capacitor, and/or inductor) coupled between the drain bonding pad (DB) of the semiconductor die 220 and the output lead 250, between the drain bonding pad (DB) and the base plate 210, and/or between the base plate 210 and the output lead 250. Such components may be used to configure the semiconductor power device 200 with desirable characteristics, such as to improve the electrical or RF impedance match between the output of the semiconductor power device 200 and an output transmission line (not shown) coupled to the output lead 250.

To reduce the thermal impedance between the top surface or active region of the semiconductor power die 220 and the base plate 210 at effectively thermal ground, the semiconductor power device 200 further includes one or more electrical conductors 282 (e.g., wirebonds or ribbons) attached (e.g., bonded) at one end to one or more drain fingers (DF) and attached (e.g., bonded) at the top metallization layer 234 of the bond support 232. As, in this example, the output signal is generated at the drain of the semiconductor power die 220, the one or more electrical conductors 282 route the output signal towards the output lead 250 in conjunction with the electrical conductors 280a performing the same function.

Because the one or more electrical conductors 282 make contact to one or more drain fingers (DF), which lies directly over the active region of the semiconductor power die 220, where most of the heat is generated, the one or more electrical conductors 282 provide one or more thermal paths between the active region and the base plate 210 at substantially thermal ground via the output lead 250 and electrical-insulator 252. This reduces the thermal impedance between the active region and the base plate 210 or reduces the junction temperature of the device 220 or allows the device 220 to operate at higher power configurations while maintaining the junction temperature within safe and reliable limits. As discussed, the one or more electrical conductors 282 may be configured as wirebonds or conductive-ribbons with a thickness between 0.5 to 3 mils or greater to achieve the desired thermal impedance or junction temperature.

In this example, the electrical conductors 282 are distributed across the semiconductor power die 220 bonded at one end to every other adjacent drain finger (DB) and at the other end to the top metallization layer 234 of the bond support 232. This provides a substantially uniform distribution of additional thermal paths across the semiconductor power die 220. However, it shall be understood that the electrical conductors 282 may be bonded to all or some of the drain fingers (DF) in any pattern to achieve the desired thermal management and electrical properties for the semiconductor power die 220.

To complete the description of the semiconductor power device 200, and with specific reference to FIG. 2B (cross-sectional view along line 2B-2B of FIG. 2A), the attachment of the semiconductor power die 220, metallic bar 230, and bond support 232 to the base plate 210 may be performed in any reliable manner. As illustrated, the input lead 240 may be electrically attached to a top metallization layer 246 disposed on the electrical-insulator 242. The electrical-insulator 242, in turn, may be attached to the base plate 210 via a bottom metallization layer 244. Similarly, the output lead 250 may be electrically attached to a top metallization layer 256 disposed on the electrical-insulator 252. The electrical-insulator 252, in turn, may be attached to the base plate 210 via a bottom metallization layer 254.

The semiconductor power die 220 receives an input signal from the input lead 240 via the set of electrical conductors 260. The semiconductor power die 220 performs some signal processing on (e.g., amplifying) the input signal to generate an output signal. The output signal is then routed to the output lead 250 via the set of electrical conductors 280a/282 and 280b.

Figure 3A:
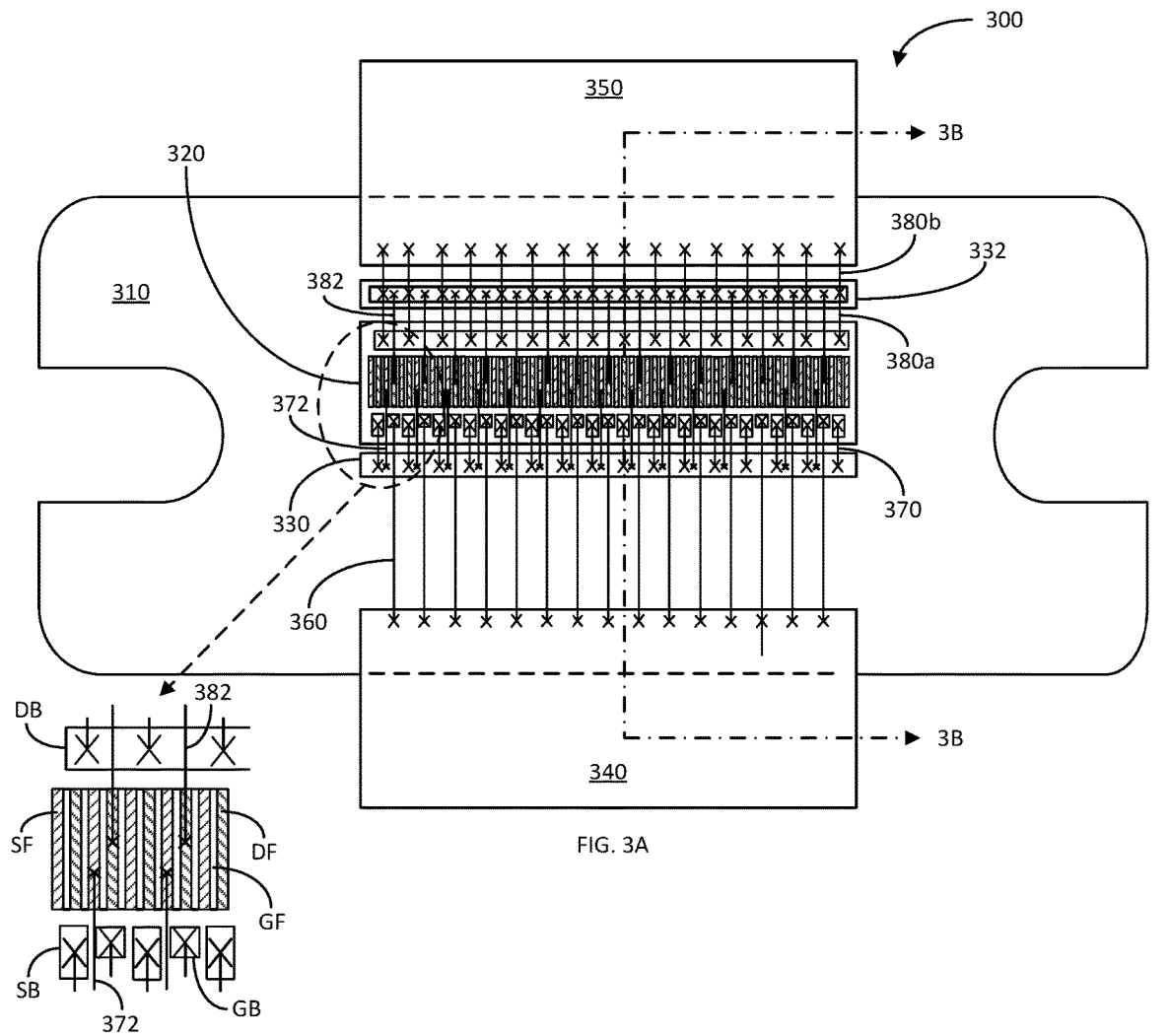
FIGS. 3A-3B illustrate top and cross-sectional views of another exemplary semiconductor power device in accordance with another aspect of the disclosure.

FIG. 3A illustrates a top view of another exemplary semiconductor power device 300 in accordance with another aspect of the disclosure. In summary, the semiconductor power device 300 is basically a combination of the semiconductor power devices 100 and 200. In particular, the semiconductor power device 300 includes one or more electrical conductors (e.g., wirebonds or ribbons) attached (e.g., bonded) at one end to one or more source fingers (SF) and the other end to a grounding metallic bar, and also includes one or more electrical conductors (e.g., wirebonds or ribbons) attached (e.g., bonded) at one end to one or more drain fingers (DF) and the other end to the top metallization layer of the bond support. Thus, the two sets of electrical conductors bonded to metallization over the active region provide additional thermal paths to reduce the thermal impedance between the active region and the base plate at substantially thermal ground, or alternatively to lower the operating junction temperature of the device.

Figure 3B:
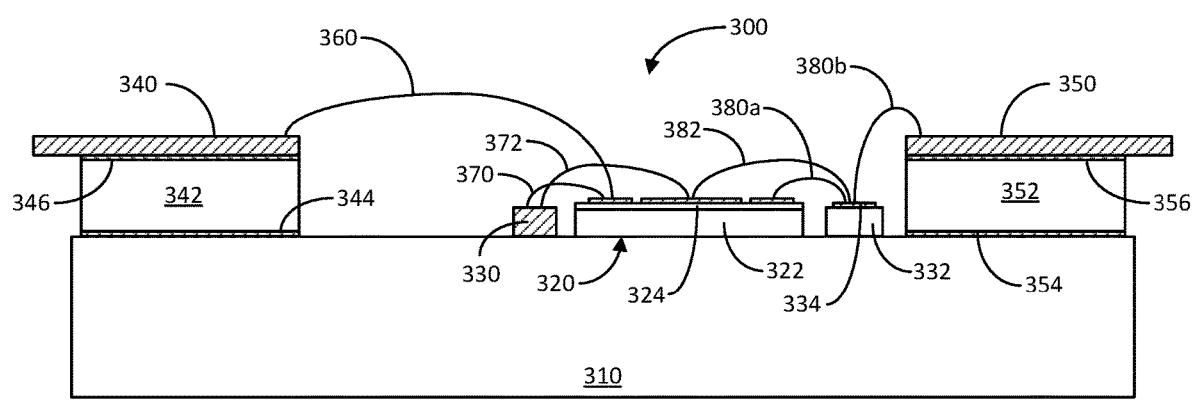

In particular, the semiconductor power device 300 includes a metallic (e.g., copper alloy) base plate 310 (e.g., a flange), a semiconductor power die 320 disposed substantially on the base plate 310, a grounding metallic bar 330 disposed substantially on the base plate 310, a bond support 332 disposed substantially on the base plate 310, an input lead 340 disposed on an electrical-insulator 342 (shown in FIG. 3B), and an output lead 350 disposed on another electrical-insulator 352 (shown in FIG. 3B). Again, in this example, the semiconductor power die 320 is configured as a GaN on SiC HEMT, but may be configured as another type of semiconductor device. Although not shown, the semiconductor power device 300 may include a cover mounted substantially on the base plate 310 so as to enclose the semiconductor power die 320, grounding bar 330, bond support 332, and portions of the input and output leads 340 and 350.

With further reference to FIG. 3B, which illustrates a cross-sectional view of the semiconductor power device 300 along line 3B-3B of FIG. 3A, the semiconductor power die 320 includes a SiC substrate 322 disposed substantially on the base plate 310, and a GaN layer 324 disposed on the SiC substrate 322. As illustrated in the accompanying blow up view, the top surface of the semiconductor power die 320 includes a set of gate bonding (metallization) pads (GB), a set of source bonding (metallization) pads (SB), a drain bonding (metallization) pad electrode (DB), a set of source (metallization) fingers (SF), a set of drain (metallization) fingers (DF), and a set of gate fingers (GF), all of which are disposed on the GaN layer 324. It shall be understood that the single drain bonding pad (DB) could be designed as an array of smaller drain bond pads adjacent to each other.

In this example, the region of the GaN layer 324 directly below the source, drain, and get fingers (SF, DF, and GF) is the active region as that region constitutes the channel of the device 320. The region of the GaN layer 324 directly below the source, drain, and gate bonding pads (SB, DB, and GB) is not the active region as the channel of the device 320 is not situated directly below the bonding pads. As discussed in more detail herein, one or more electrical-conductors (e.g., wirebonds or ribbons) 372 are attached (e.g., bonded) to one or more of the source fingers (SF) and another one or more electrical-conductors (e.g., wirebonds or ribbons) 382 are attached (e.g., bonded) to one or more drain fingers (DF) to produce additional thermal paths between the active region of the device 320 and the base plate 310, which substantially functions as thermal ground.

The semiconductor power device 300 further includes a set of wirebonds or conductive-ribbons (generally, electrical conductors) 360 electrically coupling the input lead 340 to the set of gate bonding pads (GB) of the semiconductor power die 320, respectively. The semiconductor power die 320 receives an input signal from the input lead 340 via the set of electrical conductors 360. As discussed further herein with respect to another implementation, it shall be understood that there may be other components (e.g., resistor, capacitor, and/or inductor) coupled between the input lead 340 and the set of gate bonding pads (GB) of the semiconductor die 320, between the input lead 340 and the base plate 310, and/or the set of gate bonding pads (GB) and the base plate 310. Such components may be used to configure the semiconductor power device 300 with desirable characteristics, such as to improve the electrical or RF impedance match between the input of the semiconductor power device 300 and an input transmission line (not shown) coupled to the input lead 340.

Additionally, the semiconductor power device 300 includes another set of wirebonds or conductive-ribbons (generally, electrical conductors) 370 electrically coupling the set of source bonding pads (SB) of the semiconductor power die 320 to the base plate 310 via the metallic bar 330 for electrical grounding purpose. Alternatively, the metallic bar 330 may be omitted and in such configuration the set of wirebonds or conductive-ribbons (generally, electrical conductors) 370 electrically couple the set of source bonding pads (SB) of the semiconductor power die 320 directly to the base plate 310 for electrical grounding purpose.

Also, the semiconductor power device 300 includes a set of wirebonds or conductive-ribbons (generally, electrical conductors) 380a electrically coupling the drain bonding pad (DB) of the semiconductor power die 320 to a top metallization layer 334 of the bond support 332, and another set of wirebonds or conductive ribbons (generally, electrical conductors) 380b electrically coupling the top metallization layer 334 of the bond support 332 to the output lead 350. The bond support 332 may be made out of a relatively high thermal conductivity material, such as beryllium oxide (BeO), silicon carbide (SiC), diamond, graphite or aluminum nitride (AlN), or a composite matrix of these with other materials or any other electrically insulating or semi-insulating high thermal conductivity material for improving the heat removal from the semiconductor power die 320 via the one or more electrical conductors 380a.

The semiconductor power die 320 produces an output signal (based on the input signal (e.g., by amplifying the input signal)) at the output lead 350 via the set of electrical conductors 380a and 380b. As discussed further herein with respect to another implementation, it shall be understood that there may be other components (e.g., resistor, capacitor, and/or inductor) coupled between the drain bonding pad (DB) of the semiconductor die 320 and the output lead 350, between the drain bonding pad (DB) and the base plate 310, and/or between the base plate 310 and the output lead 350. Such components may be used to configure the semiconductor power device 300 with desirable characteristics, such as to improve the electrical or RF impedance match between the output of the semiconductor power device 300 and an output transmission line (not shown) coupled to the output lead 350.

To reduce the thermal impedance between the top surface or active region of the semiconductor power die 320 and the base plate 310 at effectively thermal ground or the junction temperature, the semiconductor power device 300 further includes one or more electrical conductors 372 attached (e.g., bonded) at one end to one or more source fingers (SF) and at the other end to the metallic bar 330 for electrical grounding purpose. Alternatively, the metallic bar 330 may be omitted and in such configuration, the semiconductor power device 300 further includes one or more electrical conductors 372 attached (e.g., bonded) at one end to one or more source fingers (SF) and at the other end to the base plate 310 for electrical grounding purpose. Additionally, the semiconductor power device 300 includes one or more electrical conductors 382 (e.g., wirebonds or ribbons) attached (e.g., bonded) at one end to one or more drain fingers (DF) and bonded at the other end to the top metallization layer 334 of the bond support 332. As, in this example, the output signal is generated at the drain of the semiconductor power die 320, the one or more electrical conductors 382 route the output signal towards the output lead 350 in conjunction with the electrical conductors 380a performing the same function.

Because the electrical conductors 372 and 382 make contact respectively to one or more source fingers (SF) and one or more drain fingers (DF), which lie directly over the active region of the semiconductor power die 320, where most of the heat is generated, the electrical conductors 372 and 382 provide additional thermal paths between the active region and the base plate 310 at substantially thermal ground via the metallic bar 330 and via the output lead 350 and electrical-insulator 352. This reduces the thermal impedance between the active region and the base plate 310 or reduces the junction temperature of the device 320 or allows the device 320 to operate at higher power configurations while maintaining the junction temperature within safe and reliable limits. As discussed, the electrical conductors 372 and 382 may be configured as wirebonds or conductive-ribbons with a thickness between 0.5 to 3 mils or greater to achieve the desired thermal impedance or junction temperature.

In this example, the electrical conductors 372 are distributed across the semiconductor power die 320 bonded at one end to every other adjacent source finger (SB) and at the other end to the metallic bar 330. Further, the electrical conductors 382 are also distributed across the semiconductor power die 320 bonded at one end to every other adjacent drain finger (DB) and at the other end to the output lead 350. This provides a substantially uniform distribution of additional thermal paths across the semiconductor power die 320. However, it shall be understood that the electrical conductors 372 and 382 may be bonded to all or some of the source and drain fingers in any pattern to achieve the desired thermal management and electrical properties for the semiconductor power die 320.

To complete the description of the semiconductor power device 300, and with specific reference to FIG. 3B (cross-sectional view along line 3B-3B of FIG. 3A), the attachment of the semiconductor power die 320, metallic bar 330, and bond support 332 to the base plate 310 may be performed in any reliable manner. As illustrated, the input lead 340 may be electrically attached to a top metallization layer 346 disposed on the electrical-insulator 342. The electrical-insulator 342, in turn, may be attached to the base plate 310 via a bottom metallization layer 344. Similarly, the output lead 350 may be electrically attached to a top metallization layer 356 disposed on the electrical-insulator 352. The electrical-insulator 352, in turn, may be attached to the base plate 310 via a bottom metallization layer 354.

The semiconductor power die 320 receives an input signal from the input lead 340 via the set of electrical conductors 360. The semiconductor power die 320 performs some signal processing on (e.g., amplifying) the input signal to generate an output signal. The output signal is then routed to the output lead 350 via the set of electrical conductors 380a/382 and 380b.

FIG. 4A illustrates a top view of another exemplary semiconductor power device 400 in accordance with another aspect of the disclosure. In summary, the semiconductor power device 400 includes a semiconductor power die that has a plurality of separate active regions (e.g., space apart from each other by non-active regions). In this example, there are eight (8) separate active regions arranged in a two (2) row by four (4) column arrays. Active regions pertaining to each column have a common drain bonding pad. As in the previous implementations, electrical conductors are bonded to one or more source fingers (SF) and/or one or more drain fingers (DF) to provide additional thermal paths between the active regions and a base plate at substantially thermal ground; thus, reducing the junction temperature of the die.

In particular, the semiconductor power device 400 includes a metallic (e.g., copper alloy) base plate 410 (e.g., a flange), a semiconductor power die 420 disposed substantially on the base plate 410, a first grounding metallic bar 430 disposed substantially on the base plate 410, a second grounding metallic bar 432 disposed substantially on the base plate 410, a bond support 434 disposed substantially on the base plate 410, an input lead 440 disposed on an electrical-insulator 442 (shown in FIG. 4B), and an output lead 450 disposed on another electrical-insulator 452 (shown in FIG. 4B).

Again, in this example, the semiconductor power die 420 is configured as a GaN on SiC HEMT, but may be configured as another type of semiconductor device. Although not shown, the semiconductor power device 400 may include a cover mounted substantially on the base plate 410 so as to enclose the semiconductor power die 420, grounding bars 430 and 432, bond support 434, and portions of the input and output leads 440 and 450.

As mentioned above, the semiconductor power die 420 includes eight (8) separate active regions arranged in a two (2) row by four (4) column array. The accompanying blow up view illustrates one column of the array, as the remaining columns are similarly configured. More specifically, each active region includes an overlying set of source (metallization) fingers (SF), a set of drain (metallization) fingers (DF), and a set of gate fingers (GF), all of which are disposed on a GaN layer 424. The active region closer to the input-side of the semiconductor power device 400 includes a set of four (4) source bonding (metallization) pads (SB) situated on the GaN layer 424 closer to the input-side. Similarly, the active region closer to the output-side of the semiconductor power device 400 includes a set of four (4) source bonding (metallization) pads (SB) situated on the GaN layer 424 closer to the output-side. Both active regions share a central drain bonding (metallization) pad (DB) separating the active regions. It shall be understood that the central drain bonding pad (DB) could be designed as an array of smaller drain bond pads adjacent to each other.

With further reference to FIG. 4B, which illustrates a cross-sectional view of the semiconductor power device 400 along line 4B-4B of FIG. 4A, the semiconductor power die 420 includes a SiC substrate 422 disposed substantially on the base plate 410, and the GaN layer 424 disposed on the SiC substrate 422. In this example, the region of the GaN layer 424 directly below the source, drain, and get fingers (SF, DF, and GF) is the active region as that region constitutes the channel of the device 420. The region of the GaN layer 424 directly below the source, drain, and gate bonding pads (SB, DB, and GB) is not the active region as the channel of the device 420 is not situated directly below the bonding pads.

The semiconductor power device 400 further includes a set of wirebonds or conductive-ribbons (generally, electrical conductors) 460 electrically coupling the input lead 440 to the set of gate bonding pads (GB) associated with each of the active regions of the semiconductor power die 420, respectively. The semiconductor power die 420 receives an input signal from the input lead 440 via the set of electrical conductors 460. As discussed further herein with respect to another implementation, it shall be understood that there may be other components (e.g., resistor, capacitor, and/or inductor) may be coupled between the input lead 440 and the set of gate bonding pads (GB) of the semiconductor die 420, between the input lead 440 and the base plate 410, and/or the set of gate bonding pads (GB) and the base plate 410. Such components may be used to configure the semiconductor power device 400 with desirable characteristics, such as to improve the electrical or RF impedance match between the input of the semiconductor power device 400 and an input transmission line (not shown) coupled to the input lead 440.

Additionally, the semiconductor power device 400 includes another set of wirebonds or conductive-ribbons (generally, electrical conductors) 470 electrically coupling the set of source bonding pads (SB) associated with each of the active regions of the semiconductor power die 420 to the base plate 410 via the grounding metallic bars 430 and 432 for electrical grounding purpose, respectively.

Also, the semiconductor power device 400 includes a set of wirebonds or conductive-ribbons (generally, electrical conductors) 480a electrically coupling the drain bonding pad (DB) associated with each column active region pair of the semiconductor power die 420 to a top metallization layer 436 of the bond support 434, and another set of wirebonds or conductive ribbons (generally, electrical conductors) 480b electrically coupling the top metallization layer 436 of the bond support 434 to the output lead 450. The bond support 434 may be made out of a relatively high thermal conductivity material, such as beryllium oxide (BeO), silicon carbide (SiC), diamond, graphite or aluminum nitride (AlN), or a composite matrix of these with other materials or any other electrically insulating or semi-insulating high thermal conductivity material for improving the heat removal from the semiconductor power die 420 via the one or more electrical conductors 480a.

The semiconductor power die 420 produces an output signal (based on the input signal (e.g., by amplifying the input signal)) at the output lead 450 via the sets of electrical conductors 480a and 480b. As discussed further herein with respect to another implementation, it shall be understood that there may be other components (e.g., resistor, capacitor, and/or inductor) may be coupled between the drain bonding pad (DB) of each of the active regions of the semiconductor die 420 and the output lead 450, between the drain bonding pad (DB) and the base plate 410, and/or between the base plate 410 and the output lead 450. Such components may be used to configure the semiconductor power device 400 with desirable characteristics, such as to improve the electrical or RF impedance match between the output of the semiconductor power device 400 and an output transmission line (not shown) coupled to the output lead 450.

To reduce the thermal impedance between the top surface or active regions of the semiconductor power die 420 and the base plate 410 at effectively thermal ground or the operating junction temperature, the semiconductor power device 400 further includes one or more electrical conductors 472 attached (e.g., bonded) at one end to source fingers (SF) associated with the input-side active regions, and at the other end to the metallic bar 430 for electrical grounding purpose. Similarly, the semiconductor power device 400 includes one or more electrical conductors 472 attached (e.g., bonded) at one end to source fingers (SF) associated with the output-side active regions, and at the other end to the metallic bar 432 for electrical grounding purpose. Alternatively, one or more of the metallic bars 430 and 432 may be omitted and in such configuration, the semiconductor power device 400 further includes one or more electrical conductors 472 attached (e.g., bonded) at one end to one or more source fingers (SF) and at the other end to the base plate 410 for electrical grounding purpose.

Additionally, the semiconductor power die 420 includes electrical conductors 482 (e.g., wirebonds or ribbons) attached (e.g., bonded) at one end to one or more drain fingers (DF) associated with the input-side active regions, and bonded at the other end to the top metallization layer 436 of the bond support 434. Similarly, the semiconductor power die 420 includes electrical conductors 484 (e.g., wirebonds or ribbons) attached (e.g., bonded) at one end to one or more drain fingers (DF) associated with the output-side active regions, and bonded at the other end to the top metallization layer 436 of the bond support 434. As, in this example, the output signal is generated at the drain of the semiconductor power die 420, the electrical conductors 482 and 484 route the output signal towards the output lead 450 in conjunction with the electrical conductors 480*a* performing the same function.

Because the electrical conductors 472, 482 and 484 make contact respectively to one or more source fingers (SF) and one or more drain fingers (DF), which lie directly over the active regions of the semiconductor power die 420, where most of the heat is generated, the electrical conductors 472, 482 and 484 provide additional thermal paths between the active regions and the base plate 410 at substantially thermal ground via the metallic bars 430 and 432, and via the bond support 434. This reduces the thermal impedance between the active regions and the base plate 410 or reduces the junction temperature of the device 420 or allows the device 420 to operate at higher power configurations while maintaining the junction temperature within safe and reliable limits.

As in the previous implementations, the electrical conductors 472, 482 and 484 may be bonded to all or some of the source and drain fingers in any pattern to achieve the desired thermal management and electrical properties for the semiconductor power die 420. Further, as discussed, the electrical conductors 472, 482 and 484 may be configured as wirebonds or conductive-ribbons with a thickness between 0.5 to 3 mils or greater to achieve the desired thermal impedance or junction temperature.

To complete the description of the semiconductor power device 400, and with specific reference to FIG. 4B (cross-sectional view along line 4B-4B of FIG. 4A), the attachment of the semiconductor power die 420, metallic bars 430 and 432, and bond support 434 to the base plate 410 may be performed in any reliable manner. As illustrated, the input lead 440 may be electrically attached to a top metallization layer 446 disposed on the electrical-insulator 442. The electrical-insulator 442, in turn, may be attached to the base plate 410 via a bottom metallization layer 443. Similarly, the output lead 450 may be electrically attached to a top metallization layer 456 disposed on the electrical-insulator 452. The electrical-insulator 452, in turn, may be attached to the base plate 410 via a bottom metallization layer 454.

The semiconductor power die 420 receives an input signal from the input lead 440 via the set of electrical conductors 460. The semiconductor power die 420 performs some signal processing on (e.g., amplifying) the input signal to generate an output signal. The output signal is then routed to the output lead 450 via the set of electrical conductors 480*a*, 482, 484, and 480*b*.

Figure 5A:
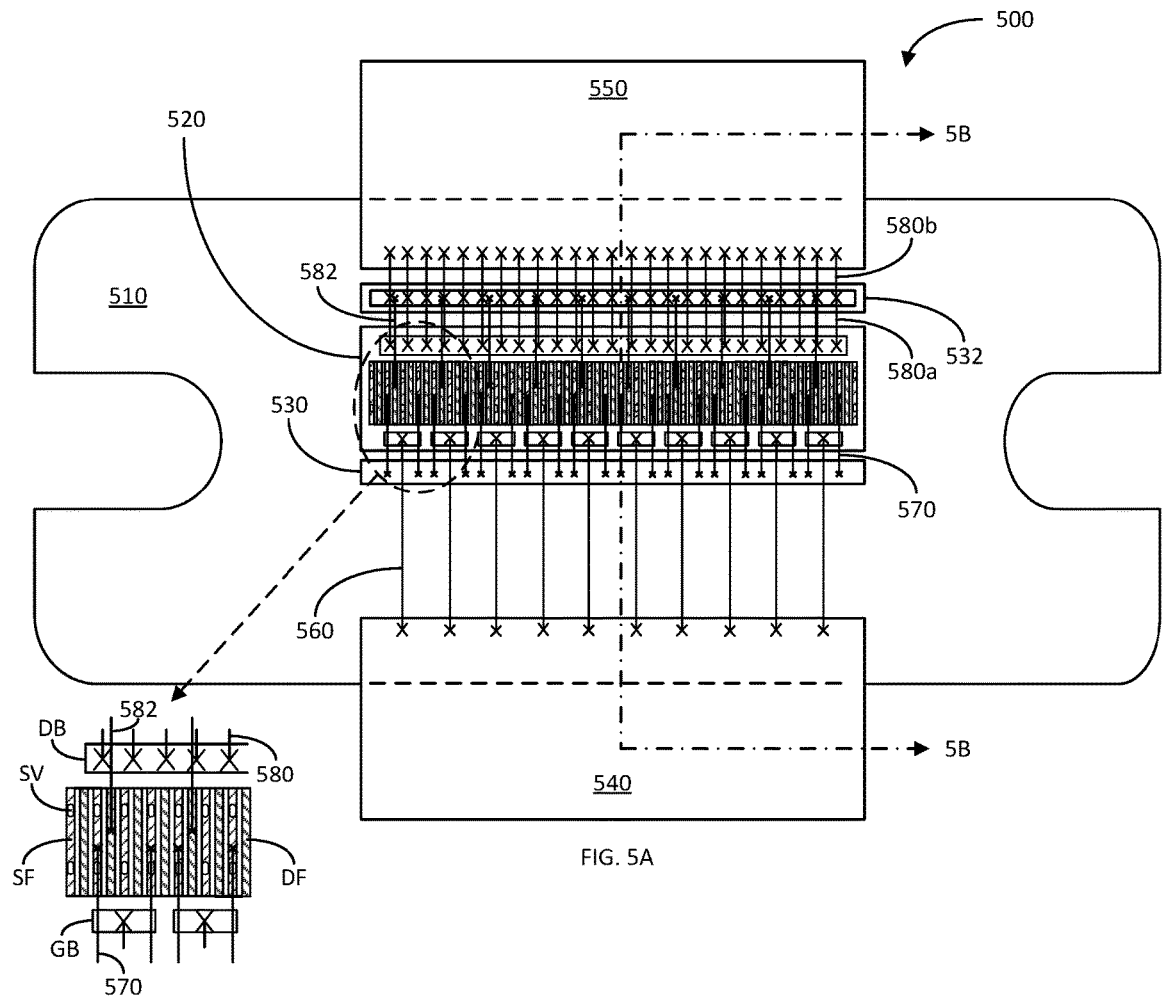
FIGS. 5A-5B illustrate top and cross-sectional views of another exemplary semiconductor power device in accordance with another aspect of the disclosure.

FIG. 5A illustrates a top view of another exemplary semiconductor power device 500 in accordance with another aspect of the disclosure. In summary, the semiconductor power device 500 includes a semiconductor power die that does not have source bonding pads, but instead provides grounding for the source via a plurality of metallized via holes (SV). Similar to the previous implementations, the semiconductor power device 500 includes electrical conductors (e.g., wirebonds or ribbons) attached to source and/or drain fingers directly overlying the active region to provide additional thermal paths between the active region and the base plate at substantially thermal ground; thus, reducing the junction temperature of the die.

Figure 5B:
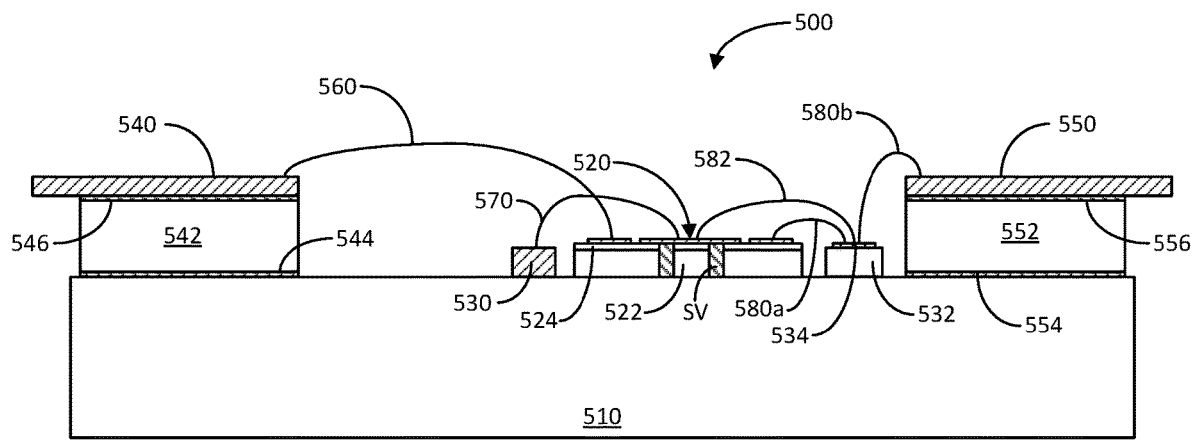

In particular, the semiconductor power device 500 includes a metallic (e.g., copper alloy) base plate 510 (e.g., a flange), a semiconductor power die 520 disposed substantially on the base plate 510, a grounding metallic bar 530 disposed substantially on the base plate 510, a bond support 532 disposed substantially on the base plate 510, an input lead 540 disposed on an electrical-insulator 542 (shown in FIG. 5B), and an output lead 550 disposed on another electrical-insulator 552 (shown in FIG. 5B). Again, in this example, the semiconductor power die 520 is configured as a GaN on SiC HEMT, but may be configured as another type of semiconductor device. Although not shown, the semiconductor power device 500 may include a cover mounted substantially on the base plate 510 so as to enclose the semiconductor power die 520, grounding bar 530, and portions of the input and output leads 540 and 550.

With further reference to FIG. 5B, which illustrates a cross-sectional view of the semiconductor power device 500 along line 5B-5B of FIG. 5A, the semiconductor power die 520 includes a SiC substrate 522 disposed substantially on the base plate 510, and a GaN layer 524 disposed substantially on the SiC substrate 522. The semiconductor power die 500 further includes metalized via holes (SV) electrically connecting the source fingers (SF) to the base plate 510 for electrical grounding purpose. As illustrated in the accompanying blow up view, the top surface of the semiconductor power die 520 includes a set of gate bonding (metallization) pads (GB), a drain bonding (metallization) pad (DB), a set of source (metallization) fingers (SF), a set of drain (metallization) fingers (DF), and a set of gate fingers (GF), all of which are disposed on the GaN layer 524. It shall be understood that the single drain bonding pad (DB) could be designed as an array of smaller drain bond pads adjacent to each other.

In this example, the region of the GaN layer 524 directly below the source, drain, and get fingers (SF, DF, and GF) is the active region as that region constitutes the channel of the device 520. The region of the GaN layer 524 directly below the drain and gate bonding pads (DB and GB) is not the active region as the channel of the device 520 is not situated directly below the bonding pads. As discussed in more detail herein, one or more electrical-conductors (e.g., wirebonds or ribbons) 570 are attached (e.g., bonded) to one or more of the source fingers (SF) and another one or more electrical-conductors (e.g., wirebonds or ribbons) 582 are attached (e.g., bonded) to one or more drain fingers (DF) to produce additional thermal paths between the active region of the device 520 and the base plate 510, which substantially functions as thermal ground.

The semiconductor power device 500 further includes a set of wirebonds or conductive-ribbons (generally, electrical conductors) 560 electrically coupling the input lead 540 to the set of gate bonding pads (GB) of the semiconductor power die 520, respectively. The semiconductor power die 520 receives an input signal from the input lead 540 via the set of electrical conductors 560. As discussed further herein with respect to another implementation, it shall be understood that there may be other components (e.g., resistor, capacitor, and/or inductor) coupled between the input lead 540 and the set of gate bonding pads (GB) of the semiconductor die 520, between the input lead 540 and the base plate 510, and/or the set of gate bonding pads (GB) and the base plate 510. Such components may be used to configure the semiconductor power device 500 with desirable characteristics, such as to improve the electrical or RF impedance match between the input of the semiconductor power device 500 and an input transmission line (not shown) coupled to the input lead 540.

Also, the semiconductor power device 500 includes a set of wirebonds or conductive-ribbons (generally, electrical conductors) 580a electrically coupling the drain bonding pad (DB) of the semiconductor power die 520 to a top metallization layer 534 of the bond support 532, and another set of wirebonds or conductive ribbons (generally, electrical conductors) 580b electrically coupling the top metallization layer 534 of the bond support 532 to the output lead 550.

The semiconductor power die 520 produces an output signal (based on the input signal (e.g., by amplifying the input signal)) at the output lead 550 via the sets of electrical conductors 580a and 580b. As discussed further herein with respect to another implementation, it shall be understood that there may be other components (e.g., resistor, capacitor, and/or inductor) coupled between the drain bonding pad (DB) of the semiconductor die 520 and the output lead 550, between the drain bonding pad (DB) and the base plate 510, and/or between the base plate 510 and the output lead 550. Such components may be used to configure the semiconductor power device 500 with desirable characteristics, such as to improve the electrical or RF impedance match between the output of the semiconductor power device 500 and an output transmission line (not shown) coupled to the output lead 550. The bond support 532 may be made out of a relatively high thermal conductivity material, such as beryllium oxide (BeO), silicon carbide (SiC), diamond, graphite or aluminum nitride (AlN), or a composite matrix of these with other materials or any other electrically insulating or semi-insulating high thermal conductivity material for improving the heat removal from the semiconductor power die 520 via the one or more electrical conductors 580a.

To reduce the thermal impedance between the top surface or active region of the semiconductor power die 520 and the base plate 510 at effectively thermal ground or the operating junction temperature, the semiconductor power device 500 further includes one or more electrical conductors 570 attached (e.g., bonded) at one end to one or more source fingers (SF) and at the other end to the metallic bar 530 for electrical grounding purpose. Alternatively, the metallic bar 530 may be omitted, in which case the semiconductor power device 500 further includes one or more electrical conductors 570 attached (e.g., bonded) at one end to one or more source fingers (SF) and at the other end directly to the base plate 510 for electrical grounding purpose. Additionally, the semiconductor power die 520 includes one or more electrical conductors 582 (e.g., wirebonds or ribbons) attached (e.g., bonded) at one end to one or more drain fingers (DF) and bonded at the other end to the top metallization layer 534 of the bond support 532. As, in this example, the output signal is generated at the drain of the semiconductor power die 520, the one or more electrical conductors 582 route the output signal towards the output lead 550 in conjunction with the electrical conductors 580a performing the same function.

Because the electrical conductors 570 and 582 make contact respectively to one or more source fingers (SF) and one or more drain fingers (DF), which lie directly over the active region of the semiconductor power die 520, where most of the heat is generated, the electrical conductors 570 and 582 provide additional thermal paths between the active region and the base plate 510 at substantially thermal ground via the metallic bar 530 and via the bond support 532. This reduces the thermal impedance between the active region and the base plate 510 or reduces the junction temperature of the device 520 or allows the device 520 to operate at higher power configurations while maintaining the junction temperature within safe and reliable limits.

In this example, the electrical conductors 570 are distributed across the semiconductor power die 520 bonded to selected source fingers (SF) and at the other end to the metallic bar 530. Further, the electrical conductors 582 are also distributed across the semiconductor power die 520 bonded to selected drain fingers (DF) and at the other end to the top metallization layer 534 of the bond support 532. This provides a substantially uniform distribution of additional thermal paths across the semiconductor power die 520. However, it shall be understood that the electrical conductors 570 and 582 may be bonded to all or some of the source and drain fingers in any pattern to achieve the desired thermal management and electrical properties for the semiconductor power die 520. As discussed, the electrical conductors 572 and 582 may be configured as wirebonds or conductive-ribbons with a thickness between 0.5 to 3 mils or greater to achieve the desired thermal impedance or junction temperature.

To complete the description of the semiconductor power device 500, and with specific reference to FIG. 5B (cross-sectional view along line 5B-5B of FIG. 5A), the attachment of the semiconductor power die 520, metallic bar 530, and bond support 532 to the base plate 510 may be performed in any reliable manner. As illustrated, the input lead 540 may be electrically attached to a top metallization layer 546 disposed on the electrical-insulator 542. The electrical-insulator 542, in turn, may be attached to the base plate 510 via a bottom metallization layer 544. Similarly, the output lead 550 may be electrically attached to a top metallization layer 556 disposed on the electrical-insulator 552. The electrical-insulator 552, in turn, may be attached to the base plate 510 via a bottom metallization layer 554.

The semiconductor power die 520 receives an input signal from the input lead 540 via the set of electrical conductors 560. The semiconductor power die 520 performs some signal processing on (e.g., amplifying) the input signal to generate an output signal. The output signal is then routed to the output lead 550 via the set of electrical conductors 580a/582 and 580b.

FIG. 6A illustrates a top view of another exemplary semiconductor power device 600 in accordance with another aspect of the disclosure. As previously mentioned, the semiconductor power devices described herein may include components between the input lead and the gate bonding pads for input impedance matching and/or other purposes. Similarly, the semiconductor power devices may also include components between the drain bonding pad and the output lead for output impedance matching and/or other purposes. Thus, to exemplify this concept, the semiconductor power device 600 includes an input series capacitor between the input lead and the gate bonding pads, and an output series capacitor between the drain bonding pad and the output lead.

In particular, the semiconductor power device 600 includes a metallic (e.g., copper alloy) base plate 610 (e.g., a flange), a semiconductor power die 620 disposed substantially on the base plate 610, an input series (or shunt depending on application) capacitor 630 disposed substantially on the base plate 610, a grounding metallic bar 635 disposed substantially on the base plate 610, a bond support 642 disposed substantially on the base plate 610, an output series (or shunt depending on application) capacitor 645 disposed substantially on the base plate 610, an input lead 640 disposed on an electrical-insulator 642 (shown in FIG.

6B), and an output lead 650 disposed on another electrical-insulator 652 (shown in FIG. 6B). Again, in this example, the semiconductor power die 620 is configured as a GaN on SiC HEMT, but may be configured as another type of semiconductor device. Although not shown, the semiconductor power device 600 may include a cover mounted substantially on the base plate 610 so as to enclose the semiconductor power die 620, input and output series capacitors 630 and 645, grounding bar 635, and portions of the input and output leads 640 and 650.

With further reference to FIG. 6B, which illustrates a cross-sectional view of the semiconductor power device 600 along line 6B-6B of FIG. 6A, the semiconductor power die 620 includes a SiC substrate 622 disposed substantially on the base plate 610, and a GaN layer 624 disposed on the SiC substrate 622. As illustrated in the accompanying blow up view, the top surface of the semiconductor power die 620 includes a set of gate bonding (metallization) pads (GB), a set of source bonding (metallization) pads (SB), a drain bonding (metallization) pad (DB), a set of source (metallization) fingers (SF), a set of drain (metallization) fingers (DF), and a set of gate fingers (GF), all of which are disposed on the GaN layer 624. It shall be understood that the single drain bonding pad (DB) could be designed as an array of smaller drain bond pads adjacent to each other.

In this example, the region of the GaN layer 624 directly below the source, drain, and get fingers (SF, DF, and GF) is the active region as that region constitutes the channel of the device 620. The region of the GaN layer 624 directly below the source, drain and gate bonding pads (SB, DB and GB) is not the active region as the channel of the device 620 is not situated directly below the bonding pads. As discussed in more detail herein, one or more electrical-conductors (e.g., wirebonds or ribbons) 672 are attached (e.g., bonded) to one or more of the source fingers (SF) and another one or more electrical-conductors (e.g., wirebonds or ribbons) 682 are attached (e.g., bonded) to one or more drain fingers (DF) to produce additional thermal paths between the active region of the device 620 and the base plate 610, which substantially functions as thermal ground.

The semiconductor power device 600 further includes a set of wirebonds or conductive-ribbons (generally, electrical conductors) 660 electrically coupling the input lead 640 to a first terminal of the input series capacitor 630, and a set of wirebonds or conductive-ribbons (generally, electrical conductors) 662 electrically coupling a second terminal of the input series capacitor 630 to the set of gate bonding pads (GB) of the semiconductor power die 620, respectively. The semiconductor power die 620 receives an input signal from the input lead 640 via the sets of electrical conductors 660 and 662. Although, in this example, an input series capacitor 630 is used to exemplify a component that may be situated between the input lead and the gate bonding pads of the semiconductor power die 620, it shall be understood that alternatively, or in addition to, other components (e.g., shunt capacitor, inductor, etc.) may also be employed to provide the semiconductor power device 600 the desired electrical properties.

Additionally, the semiconductor power device 600 includes another set of wirebonds or conductive-ribbons (generally, electrical conductors) 670 electrically coupling the set of source bonding pads (SB) of the semiconductor power die 620 to the base plate 610 via the metallic bar 630 for electrical grounding purpose. Alternatively, the metallic bar 635 may be omitted, in which case the semiconductor power device 600 includes another set of wirebonds or conductive-ribbons (generally, electrical conductors) 670 electrically coupling the set of source bonding pads (SB) of the semiconductor power die 620 directly to the base plate 610 for electrical grounding purpose.

Also, the semiconductor power device 600 includes a set of wirebonds or conductive-ribbons (generally, electrical conductors) 680a electrically coupling the drain bonding pad (DB) of the semiconductor power die 620 to a top metallization layer of the bond support 642, a set of wirebonds or conductive-ribbons (generally, electrical conductors) 680b electrically coupling the top metallization of the bond support 642 to a first terminal of the output series capacitor 645, and another set of wirebonds or conductive-ribbons (generally, electrical conductors) 680c electrically coupling a second terminal of the output series capacitor 645 to the output lead 650. The semiconductor power die 620 produces an output signal (based on the input signal (e.g., by amplifying the input signal)) at the output lead 650 via the set of electrical conductors 680a, 680b, and 680c. Although, in this example, the output series capacitor 645 is used to exemplify a component that may be situated between the drain bonding pads of the semiconductor power die 620 and the output lead 650, it shall be understood that alternatively, or in addition to, other components (e.g., shunt capacitor, inductor, etc.) may also be employed to provide the semiconductor power device 600 the desired electrical properties.

To reduce the thermal impedance between the top surface or active region of the semiconductor power die 620 and the base plate 610 at effectively thermal ground or the operating junction temperature, the semiconductor power device 600 further includes one or more electrical conductors 672 attached (e.g., bonded) at one end to one or more source fingers (SF) and at the other end to the metallic bar 635 for electrical grounding purpose. Alternatively, the metallic bar 635 may be omitted, in which case the semiconductor power device 600 further includes one or more electrical conductors 672 attached (e.g., bonded) at one end to one or more source fingers (SF) and at the other end directly to the base plate 610 for electrical grounding purpose. Additionally, the semiconductor power die 620 includes one or more electrical conductors 682 (e.g., wirebonds or ribbons) attached (e.g., bonded) at one end to one or more drain fingers (DF) and attached (e.g., bonded) at the other end to the top metallization layer of the bond support 642. As, in this example, the output signal is generated at the drain of the semiconductor power die 620, the one or more electrical conductors 682 route the output signal to the output lead 650 in conjunction with the electrical conductors 680a, 680b, and 680c performing similar functions.

Because the electrical conductors 672 and 682 make contact respectively to one or more source fingers (SF) and one or more drain fingers (DF), which lie directly over the active region of the semiconductor power die 620, where most of the heat is generated, the electrical conductors 672 and 682 provide additional thermal paths between the active region and the base plate 610 at substantially thermal ground via the metallic bar 635 and via the bond support 642, which may be made out of beryllium oxide (BeO), silicon carbide (SiC), diamond, graphite or aluminum nitride (AlN), or a composite matrix of these with other materials or any other electrically insulating or semi-insulating high thermal conductivity material for improving the heat removal from the semiconductor power die 620.

The output series capacitor 645, as well as the input series capacitor 630, may each include a dielectric comprised of a relatively high thermal conductivity material, such as beryllium oxide (BeO), silicon carbide (SiC), diamond, graphite or aluminum nitride (AlN) for improving the heat removal from the semiconductor power die 620. In such case, the bond support 642 may be eliminated, and the drain bonding pad (DB) of the semiconductor power die 620 may be electrically coupled directly to the first terminal of the output series capacitor 645 via electrical conductors 680a and 682. Again, this reduces the thermal impedance between the active region and the base plate 610 or reduces the junction temperature of the device 620 or allows the device 620 to operate at higher power configurations while maintaining the junction temperature within safe and reliable limits.

In this example, the electrical conductors 672 are distributed across the semiconductor power die 620 bonded to selected source fingers (SF) and at the other end to the metallic bar 635. Further, the electrical conductors 682 are also distributed across the semiconductor power die 620 bonded to selected drain fingers (DF) and at the other end to the first terminal of the output series capacitor 645. This provides a substantially uniform distribution of additional thermal paths across the semiconductor power die 620. However, it shall be understood that the electrical conductors 672 and 682 may be bonded to all or some of the source and drain fingers in any pattern to achieve the desired thermal management and electrical properties for the semiconductor power die 620. As discussed, the electrical conductors 672 and 682 may be configured as wirebonds or conductive-ribbons with a thickness between 0.5 to 3 mils or greater to achieve the desired thermal impedance or junction temperature.

To complete the description of the semiconductor power device 600, and with specific reference to FIG. 6B (cross-sectional view along line 6B-6B of FIG. 6A), the attachment of the semiconductor power die 620, capacitors 630 and 645, and metallic bar 635 to the base plate 610 may be performed in any reliable manner. As illustrated, the input lead 640 may be electrically attached to a top metallization layer 646 disposed on the electrical-insulator 642. The electrical-insulator 642, in turn, may be attached to the base plate 610 via a bottom metallization layer 644. Similarly, the output lead 650 may be electrically attached to a top metallization layer 656 disposed on the electrical-insulator 652. The electrical-insulator 652, in turn, may be attached to the base plate 610 via a bottom metallization layer 654.

The semiconductor power die 620 receives an input signal from the input lead 640 via the sets of electrical conductors 660 and 662. The semiconductor power die 620 performs some signal processing on (e.g., amplifying) the input signal to generate an output signal. The output signal is then routed to the output lead 650 via the sets of electrical conductors 680 and 684.

Although in the various implementation described herein, a single electrical conductor is attached is a single source or drain finger, it shall be understood that more than one electrical conductors may be attached to each source or drain finger.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A semiconductor power device, comprising:
   a base plate;
   an input lead;
   an output lead;
   a semiconductor power die disposed over the base plate, wherein the semiconductor power die is configured to receive an input signal from the input lead and generate an output signal at the output lead, and wherein the semiconductor power die includes metallization disposed over an active region, wherein the semiconductor power die is configured as a field effect transistor (FET) type device, wherein the active region is the channel of the FET type device, wherein the metallization includes a set of source fingers and a set of drain fingers, and wherein the semiconductor power die comprises:
      one or more gate bonding pads disposed directly over a non-active-region of the semiconductor power die; and
      one or more drain bonding pads disposed directly over the non-active-region of the semiconductor power die; and
   a first set of one or more electrical conductors attached to the metallization directly over the active region of the semiconductor power die.

2. The semiconductor power device of claim 1, wherein the first set of one or more electrical conductors include one or more first ends attached to one or more of the source fingers of the FET type device, respectively.

3. The semiconductor power device of claim 2, further comprising a metallic bar disposed substantially on the base plate, wherein the first set of one or more electrical conductors include one or more second ends attached to the metallic bar.

4. The semiconductor power device of claim 1, wherein the first set of one or more electrical conductors include one or more first ends attached to one or more of the drain fingers of the FET type device, respectively.

5. The semiconductor power device of claim 4, further comprising a bond support including a top metallization layer disposed substantially on the base plate, wherein the first set of one or more electrical conductors include one or more second ends attached to the metallization layer of the bond support.

6. The semiconductor power device of claim 5, wherein the bond support includes at least one of beryllium oxide (BeO), silicon carbide (SiC), diamond, graphite, or aluminum nitride (AlN).

7. The semiconductor power device of claim 4, further comprising a capacitor disposed on the base plate, wherein the first set of one or more electrical conductors include one or more second ends attached to a terminal of the capacitor.

8. The semiconductor power device of claim 7, wherein the capacitor includes a dielectric material comprising at least one of beryllium oxide (BeO), silicon carbide (SiC), diamond, graphite, or aluminum nitride (AlN).

9. The semiconductor power device of claim 1,
   wherein a first subset of the first set of electrical conductors comprises:
      one or more first ends attached to one or more of the source fingers of the FET type device, respectively; and
      one or more second ends attached to a metallic bar disposed on the base plate; and
   wherein a second subset of the first set of electrical conductors comprises:
      one or more first ends attached to one or more of the drain fingers of the FET type device, respectively; and one or more second ends attached to a bond support or a capacitor disposed on the base plate.

10. The semiconductor power device of claim 1, further comprising a second set of one or more electrical conductors bonded to the one or more gate bonding pads, respectively, wherein the semiconductor power die is configured to receive the input signal via the second set of one or more electrical conductors.

11. The semiconductor power device of claim 10, further comprising a capacitor disposed substantially on the base plate, wherein the second set of one or more electrical conductors are attached to a terminal of the capacitor.

12. The semiconductor power device of claim 11, wherein the capacitor includes a dielectric material comprising at least one of beryllium oxide (BeO), silicon carbide (SiC), diamond, graphite, or aluminum nitride (AlN).

13. The semiconductor power device of claim 1, further comprising a second set of one or more electrical conductors attached to the one or more drain bonding pads, respectively, wherein the output signal is configured to be routed to the output lead via the second set of one or more electrical conductors.

14. The semiconductor power device of claim 1, wherein the semiconductor power die further comprises one or more source bonding pads disposed directly over the non-active-region of the semiconductor power die.

15. The semiconductor power device of claim 14, further comprising a second set of one or more electrical conductors attached to the one or more source bonding pads, respectively, wherein the second set of one or more electrical conductors are electrically coupled to the base plate.

16. A semiconductor power device, comprising:
a base plate;
an input lead;
an output lead;
a semiconductor power die disposed over the base plate, wherein the semiconductor power die is configured to receive an input signal from the input lead and generate an output signal at the output lead, wherein the semiconductor power die includes metallization disposed over an active region, wherein the semiconductor power die is configured as a field effect transistor (FET) type device, wherein the active region is the channel of the FET type device, and wherein the metallization includes a set of source fingers and a set of drain fingers, and wherein the semiconductor power die comprises one or more metalized via holes electrically coupling the one or more source fingers to the base plate; and
a set of one or more electrical conductors attached to the metallization directly over the active region of the semiconductor power die.

17. The semiconductor power device of claim 1, wherein the channel includes a set of separate channels of the FET type device, and wherein the set of source fingers and the set of drain fingers disposed are directly over the separate channels, respectively.

18. A semiconductor power device, comprising:
a base plate;
an input lead;
an output lead;
a field effect transistor (FET) power die disposed over the base plate, wherein the FET power die includes a set of source fingers, a set of drain fingers, and a set of gate fingers disposed directly over an active region, wherein the set of gate fingers is configured to receive an input signal from the input lead, and wherein the FET power die is configured to process the input signal to generate an output signal at the set of drain fingers for routing to the output lead, and wherein the FET comprises:
one or more gate bonding pads disposed directly over a non-active-region of the FET; and
one or more drain bonding pads disposed directly over the non-active-region of the FET; and
a set of one or more electrical conductors attached to at least one of the set of source fingers or the set of drain fingers directly over the active region of the FET power die.

19. The semiconductor power device of claim 18, wherein the FET power die is configured as a gallium-nitride (GaN) on silicon carbide (SiC) high electron mobility transistor (HEMT).

* * * * *